(12) United States Patent
Gogl et al.

(10) Patent No.: US 9,183,912 B2
(45) Date of Patent: Nov. 10, 2015

(54) CIRCUIT AND METHOD FOR CONTROLLING MRAM CELL BIAS VOLTAGES

(71) Applicant: EverSpin Technologies, Inc., Chandler, AZ (US)

(72) Inventors: Dietmar Gogl, Austin, TX (US); Syed M. Alam, Austin, TX (US); Thomas Andre, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 141 days.

(21) Appl. No.: 13/892,107

(22) Filed: May 10, 2013

(65) Prior Publication Data

US 2013/0308374 A1 Nov. 21, 2013

Related U.S. Application Data

(60) Provisional application No. 61/648,451, filed on May 17, 2012.

(51) Int. Cl.
*G11C 11/16* (2006.01)
*G11C 13/00* (2006.01)
*G11C 5/14* (2006.01)

(52) U.S. Cl.
CPC ............ *G11C 11/1675* (2013.01); *G11C 5/147* (2013.01); *G11C 11/1697* (2013.01); *G11C 13/0069* (2013.01); *G11C 2213/79* (2013.01)

(58) Field of Classification Search
CPC ........ G11C 5/147; G11C 11/15; G11C 13/00; G11C 13/0004; G11C 13/0038; G11C 13/0069; G11C 2213/79
See application file for complete search history.

(56) References Cited

U.S. PATENT DOCUMENTS

| | | | |
|---|---|---|---|
| 5,835,420 A * | 11/1998 | Lee et al. | 365/189.09 |
| 6,016,271 A * | 1/2000 | Rolandi et al. | 365/185.18 |
| 6,055,178 A | 4/2000 | Naji | |
| 6,317,376 B1 | 11/2001 | Tran et al. | |
| 6,385,109 B1 | 5/2002 | Naji | |
| 6,483,768 B2 | 11/2002 | Bohm et al. | |
| 6,496,436 B2 | 12/2002 | Naji | |
| 6,501,686 B2 | 12/2002 | Boehm et al. | |
| 6,577,528 B2 | 6/2003 | Gogl et al. | |
| 6,600,814 B1 | 7/2003 | Carter et al. | |
| 6,639,829 B2 | 10/2003 | Gogl et al. | |
| 6,778,431 B2 | 8/2004 | Gogl et al. | |
| 6,831,853 B2 * | 12/2004 | Lin et al. | 365/154 |
| 7,068,531 B2 | 6/2006 | Katti | |
| 7,126,844 B2 | 10/2006 | Theel | |
| 7,411,815 B2 | 8/2008 | Gogl | |
| 7,411,854 B2 | 8/2008 | Klostermann et al. | |

(Continued)

OTHER PUBLICATIONS

USPTO, International Searching Authority, International Search Report and Written Opinion for International Application No. PCT/US13/41272, mailed Jan. 22, 2014.

(Continued)

*Primary Examiner* — Vanthu Nguyen

(57) ABSTRACT

A cell bias control circuit maximizes the performance of devices in the read/write path of memory cells (magnetic tunnel junction device+transistor) without exceeding leakage current or reliability limits by automatically adjusting multiple control inputs of the read/write path at the memory array according to predefined profiles over supply voltage, temperature, and process corner variations by applying any specific reference parameter profiles to the memory array.

23 Claims, 8 Drawing Sheets

(56) References Cited

U.S. PATENT DOCUMENTS

| | | | |
|---|---|---|---|
| 7,760,543 B2* | 7/2010 | Ueda | 365/158 |
| 7,903,454 B2 | 3/2011 | Gogl et al. | |
| 8,081,501 B2 | 12/2011 | Choi et al. | |
| 8,295,083 B2* | 10/2012 | Abedifard | 365/171 |
| 2005/0174859 A1 | 8/2005 | Mori et al. | |
| 2011/0249491 A1* | 10/2011 | Abedifard et al. | 365/171 |

OTHER PUBLICATIONS

Yiqing Ding; A Novel Self-Adaptive Wordline Voltage Generator for High Operational Reliability in Phase Change Memory; Integrated Ferroelectrics: An International Journal; vol. 90, Issue 1, 2007. (abstract) (http://www.tandfonline.com/doi/abs/10.1080/10584580701247474?journalCode=ginf20#preview).

* cited by examiner

−PRIOR ART−

−PRIOR ART−

−PRIOR ART−

−PRIOR ART−

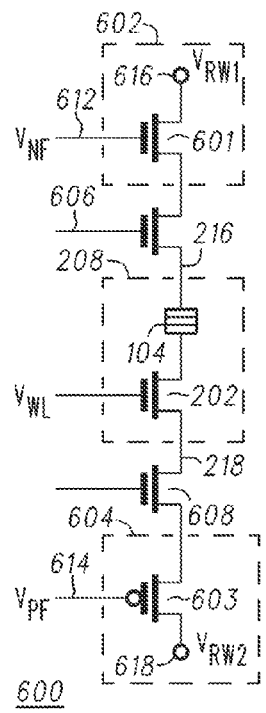
*FIG. 6* —PRIOR ART—
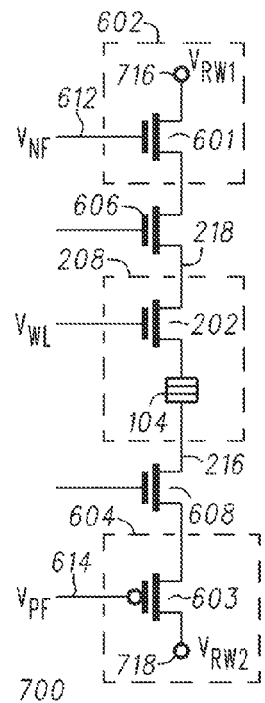
*FIG. 7* —PRIOR ART—
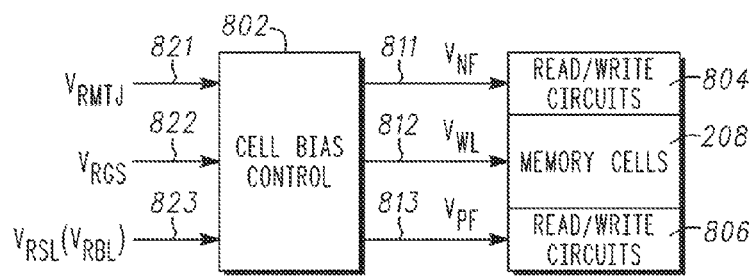
*FIG. 8*

CIRCUIT AND METHOD FOR CONTROLLING MRAM CELL BIAS VOLTAGES

This application claims the benefit of U.S. Provisional Application No. 61/648,451 filed 17 May 2012, the entirety of which is incorporated herein by reference.

TECHNICAL FIELD

The exemplary embodiments described herein generally relate to a spin-torque MRAM and more particularly to circuitry and a method for controlling cell bias voltages when writing to and reading from a spin-torque MRAM.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (logic "0" state) and high (logic "1" state) electrical resistance states, respectively. Accordingly, a detection of the resistance allows a magnetoresistive memory element, such as an MTJ device, to provide information stored in the magnetic memory element. A high magnetoresistance (MR) value, which is the ratio of the resistance difference of the two states to the low resistance state, is desirable for increasing sensing signal and fast read operation.

There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. A reset current pulse will cause the final state to be parallel or logic "0". A set current pulse, in the opposite polarity of the reset current pulse, will cause the final state to be antiparallel or logic "1". Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element.

Spin-torque MRAM (ST-MRAM), also known as spin-transfer torque RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes. However, the resistance of the MTJ is a small fraction of the voltage divider (for example, a word line select transistor, two column multiplexer transistors, and the bit and source lines) of the read/write path. The read operation requires precise control of the MTJ voltage drop, and the write operation requires optimum control of transistor devices for maximum write voltage, over PVT (process, voltage, and temperature), all the while meeting device reliability and leakage currents requirements.

Accordingly, circuitry and a method are disclosed for controlling the voltages or currents biasing the ST-MRAM cell. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

Circuitry and a method for automatically and simultaneously adjusting multiple control inputs of the RD/WRT path of a spin-torque magnetoresistive random access memory are provided.

A first exemplary embodiment is a method of controlling a plurality of biases applied to each of a plurality of memory devices, wherein a first terminal of each memory device is coupled to a bit line, a second terminal of each memory device is coupled to a first terminal of a select device (for example, a transistor), the select device having a control terminal coupled to a word line, and a second terminal of the select device coupled to a source line, the biases being applied to each of the memory devices by a bit line driver circuit coupled to the bit line, a source line driver circuit coupled to the source line, and a word line driver circuit coupled to the word line, the method comprising applying a first control bias to a control input of a replica bit line driver, the replica bit line driver having an output coupled to a replica bit line, wherein each replica memory device comprises a first terminal coupled to a replica bit line, a second terminal coupled to a first terminal of a replica select device, the select device having a control terminal coupled to a replica word line, and a second terminal coupled to a replica source line; applying a second control bias to a control input of a replica source line driver, the replica source line driver having an output coupled to the source line driver circuit and a second terminal of the replica memory device; applying a third control bias to a control input of a replica word line driver, the replica word line driver coupled to the word line driver circuit and a control terminal of a replica select device coupled to the replica memory device; adjusting the magnitude of the first control bias in response to the voltage at the first terminal of the replica memory device; and adjusting the magnitude of the second control bias in response to the voltage at the second terminal of the replica select device.

A second exemplary embodiment is a method of biasing a magnetic memory coupled between a bit line and a source line and including a memory cell coupled in series with a select device (for example, a transistor), the method comprising adjusting a first bias voltage, provided to a first transistor coupled to a replica bit line, in response to a replica bit line voltage on the replica bit line, wherein a replica magnetic memory is coupled between the replica bit line and a replica source line and including a replica memory cell coupled in series with a replica select device; adjusting a second bias voltage, provided to a second transistor coupled to the replica source line, in response to a replica source line voltage on the replica source line; and adjusting a third bias voltage, provided to a control electrode of the replica select device, in response to a select device voltage between the replica select device control electrode and one of replica select device current carrying electrodes.

A third exemplary embodiment is a memory array comprising a plurality of bit lines; a plurality of source lines; a plurality of word lines; and a plurality memory cells arranged in a plurality of columns, each of the memory cells comprising a select device; and a memory device coupled in series with the select device, each memory cell configured to be coupled to one of the word lines, and selectively coupled between one of the bit lines and one of the source lines; a replica column comprising a replica bit line; a replica source line; a replica memory cell coupled between the replica bit line and the replica source line, the replica memory cell comprising a replica memory device; and a replica select device coupled to the replica memory device and having a control electrode and at least one current carrying electrode; at least one regulator circuit configured to regulate one of a source line voltage on a selected source line or a bit line voltage on a selected bit line; regulate a word line voltage on a selected word line in response to a voltage across the control electrode and at least one current carrying electrode of the replica memory select device; and regulate a memory device voltage across the memory device in response to a reference memory device voltage and a replica voltage across the replica memory device.

A fourth exemplary embodiment is a method of providing bias voltages to a magnetic memory array including a plurality of columns of memory cells, each of the memory cells including a memory device coupled in series with a select device, each memory cell configured to be selectively coupled between a bit line and a source line, and each select device coupled to a word line, the method comprising, when current is flowing through the memory cell in a first direction, applying a source line voltage on the source line; regulating a word line voltage on the word line to the sum of the source line voltage and a voltage across a gate and a source of the select device to match a reference select device gate to source voltage; and regulating a memory device voltage across the memory device to match a reference memory device voltage; and when current is flowing through the memory cell in a second direction, applying a bit line voltage on the bit line; regulating a word line voltage on the word line to the sum of the source line voltage and a memory device voltage across the memory device and a voltage across a gate and a source of the select device to match a reference select device gate to source voltage; and regulating a memory device voltage across the memory device to match a reference memory device voltage.

BRIEF DESCRIPTION OF THE DRAWINGS

The present invention will hereinafter be described in conjunction with the following drawing figures, wherein like numerals denote like elements.

FIG. 6 is a schematic of a known STT-MRAM cell coupled between peripheral devices with a column of the array for writing or reading in a first current direction;

FIG. 7 is a schematic of a known STT-MRAM cell coupled between peripheral devices with a column of the array for writing or reading in a second current direction FIG. 8 is a block diagram of a cell bias control circuit for biasing an array of STT-MRAM cells in accordance with a first exemplary embodiment;

DETAILED DESCRIPTION

Figure 1:
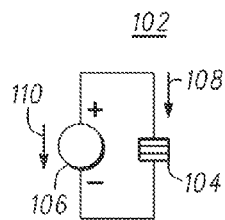
FIGS. 1-4 are schematics of known biasing conditions for writing and reading of STT-MRAM cells.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

Precise control of magnetic tunnel junction (MTJ) read/write (RD/WRT) bias conditions is accomplished by automatically and simultaneously controlling multiple reference voltages of array control devices. These reference voltages may be partially or fully dependent on each other. A cell bias control circuit enhances or maximizes the performance of devices in the RD/WRT path of memory cells (MTJ+select device) without exceeding leakage current or reliability limits or parameters by automatically adjusting multiple control inputs of the RD/WRT path at the memory array according to predefined profiles over supply voltage, temperature, and process variations by applying any specific reference parameter profiles to the memory array.

Exemplary embodiments described herein include RD/WRT paths having current flowing in the down current direction and in the up current direction.

In the down current direction, a select device (for example, transistor) of a memory cell is connected to a lower bias potential and the MTJ is connected to higher bias potential. A source line voltage is regulated to correlate to (for example, match or equal) a reference source line voltage using a P follower device, and a word line voltage is regulated to correlate to (for example, equal) the sum of the reference source line voltage and a reference gate to source voltage as applied to a word line select device. A voltage across the MTJ is regulated to equal a reference MTJ voltage by a voltage applied to an N follower device. All three of the above regulations are affected by the current through the RD/WRT path.

In the up current direction, a select device is connected to a higher bias potential and the MTJ is connected to a lower bias potential. A bit line voltage is regulated to correlate to (for example, match or equal) a reference bit line voltage using a P follower device, and a word line voltage is regulated to correlate to (for example, equal) the sum of the reference bit line voltage, a reference MTJ voltage, and a reference gate to source voltage. A voltage across the MTJ is regulated to correlate to (for example, equal) a reference MTJ voltage by a voltage applied to an N follower device. All three of the above regulations are affected by the current through the RD/WRT path.

The cell bias control unit contains a replica of the RD/WRT path of the memory array and adjusts the voltage across the MTJ (or suitable substitute device) in these reference paths for RD/WRT configurations by creating multiple analog reference voltages for the transistors in the reference path. By applying these reference voltages created by the cell bias control unit to the devices in the memory array RD/WRT path, a voltage across the MTJ is sufficiently close to the voltage over the MTJ in the replica path of the bias control unit is achieved.

The cell bias control circuit provides a negative PMOS follower gate voltage to raise the bit line or source line voltage to a predetermined voltage above ground to reduce sub-threshold leakage of the word line select devices. The cell bias control circuit generates a control voltage driving a P follower device which is further dependent on the desired applied voltage across the reference MTJ or other suitable devices, e.g., a resistor, in the RD/WRT path of the replica circuit.

The cell bias control circuit for a read operation applies a predefined voltage across a reference device in the reference path, e.g., an MTJ or a resistor equivalent to the highest high state of an MTJ resistance in the memory array for read bias generation to avoid write disturb problems during read.

The cell bias control circuit for the write bias direction, with the MTJ being connected to a lower bias potential and the select device being connected to a higher bias potential, applies a predefined voltage across a reference device, e.g., a MTJ, or a resistor equivalent to the lowest low state of an MTJ resistance in the memory array to maximize switching yield and control reliability of the word line select device across the range of MTJ resistance. These predefined voltages of the cell bias control circuit are trimable voltages that may be programmed during and/or after, for example, testing or binning (for example, the voltage may be fuse or metal mask programmed).

The described embodiments are only examples. Further modifications or simplifications may be made dependent, for example, on area, current/power, and voltage precision decisions.

In the replica of the RD/WRT path of the memory array, any device can be replaced by another suitable device, e.g., the MTJ can be replaced by a resistor or the like. Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers are used to identify like elements according to the different figures that illustrate the various exemplary embodiments.

An MRAM array includes write drivers and sense-amplifiers positioned near a plurality of magnetoresistive bits. A write, or program, operation begins when a current of either one of the two different and opposite polarities, set or reset, is applied through the magnetic storage element, e.g., magnetic tunnel junction (MTJ). Such write mechanism is employed in spin-transfer torque (STT) or spin torque (ST) MRAM. The spin-torque effect is known to those skilled in the art. Briefly, a current becomes spin-polarized after the electrons pass through the first magnetic layer in a magnetic/non-magnetic/magnetic tri-layer structure, where the first magnetic layer is substantially more magnetically stable than the second magnetic layer. The higher magnetic stability of the first layer compared to the second layer may be determined by one or more of several factors including: a larger magnetic moment due to thickness or magnetization, coupling to an adjacent antiferromagnetic layer, coupling to another ferromagnetic layer as in a synthetic antiferromagnetic (SAF) structure, or a high magnetic anisotropy. The spin-polarized electrons cross the nonmagnetic spacer and then, through conservation of spin angular momentum, exert a spin torque on the second magnetic layer that causes precession of its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

Figure 2:
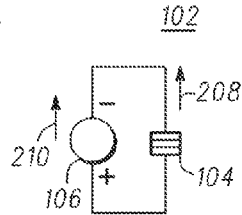
Figure 3:
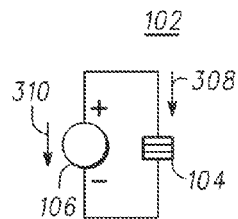
Figure 4:
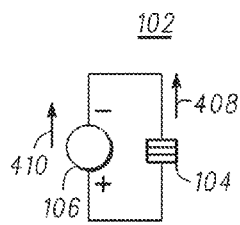

FIGS. 1, 2, 3, and 4 illustrate known bias conditions for writing and reading of STT-MRAM cells 102, wherein an MTJ 104 is connected to a voltage/current source 106. In order to write a "0" to the memory cell 102, a write current 108 is applied to the MTJ. This current can alternatively be created by an applied write voltage 110 (FIG. 1). In order to program the MTJ 104 in the opposite direction, e.g., for writing a "1", the current 208 is applied (FIG. 2) in the opposite direction (from that shown in FIG. 1) at the MTJ 104. Instead of applying a write current 208, a write voltage 210 can be used (FIG. 2). FIG. 3 shows a read operation at the MTJ 104. Depending on the sensing method used, a read voltage 310 is applied and the read current 308 is measured by the sense amplifier (not shown) of the memory array. Alternatively, a read current 308 can be applied to the MTJ 104 and the resulting voltage 310 at the MTJ 104 can be evaluated by the sense amplifier. For the RD operation, it can be chosen in which direction the memory cell 104 is read, which is the same situation as for the current 108 and 208 direction for writing a "0" or "1" but at a lower read voltage 410 (FIG. 4).

Figure 5:
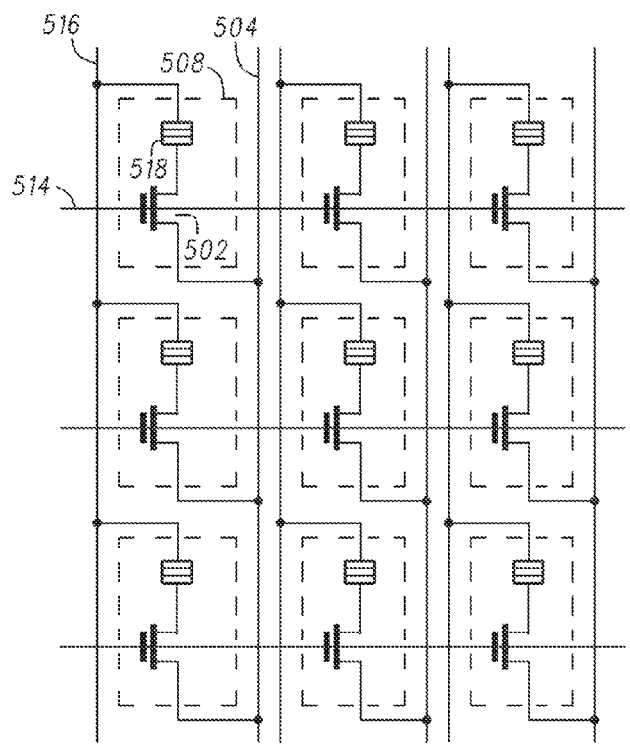
FIG. 5 is a schematic of a known array of STT-MRAM cells.

The MTJ elements shown in FIG. 1-4 are typically used in a known SST memory array 500 configuration (FIG. 5). In order to select specific memory elements 508 within the memory array 500 during RD or WRT operation, the MTJ 504 is typically combined with a select device 502 acting as a switch. The combination of the select device 502 and MTJ 504 is a single memory element (also known as a bit or memory cell) 508 within the memory array 500. In order to reduce the number of conductive paths connecting individual memory cells 508 in the array 500, neighboring memory cells 508 share common control lines, e.g. word lines 514, bit lines 516, and source lines 504, as shown in FIG. 5. At the periphery of the memory array 500, a row decoder (not shown) selects the shared word line 514 of a desired memory cell 508. The bit line 516 and source line 504 of the desired memory cell 508 are usually selected by column selector switches (not shown). This also enables multiplexing a larger number of bit lines 516 or source lines 504 to a shared read or write circuit (not shown).

A more detailed view of known RD/WRT circuitry 602, 604 and peripheral devices (column selector transistors 606, 608) included around the memory array 500 are shown in FIGS. 6 and 7 and are described in detail in U.S. patent application Ser. No. 13/679,454 assigned to the Assignee of the invention claimed herein. The write operation of a "0" to the memory cell 208 is described in the configuration (column or read/write path) 600 of FIG. 6. The bit line 216 and source line 218 of the memory cell 208 are connected to the upper RD/WRT circuitry 602 and lower RD/WRT circuitry 604 by the column selector switches 606 and 608, respectively. The column selector switches 606, 608 multiplex the bit line 216 and source 218 of the selected memory cell 208 to a shared write circuit or sense amplifier (not shown), when, for example, the area requirement or power consumption does not allow the use of such a circuit at every individual bit line 216 or source 218. Write circuits or sense amplifiers may optionally have their inputs separated from the bit line 216 or source line 218 during certain phases of operation.

As also shown in FIG. 6, included in the RD/WRT circuits 602, 604 are simple source follower devices 601, 603 used to control the voltage at the bit line 216 and source line 218 of the memory cell 208 by voltages applied at gates 612 and 614. For write operations, the source follower devices 601, 603 may connect to a suitable higher bias potential (a first read/write voltage $V_{RW1}$) at terminal 616 and lower bias potential (a second read/write voltage $V_{RW2}$) at terminal 618, respectively, in order to create the write current 108 from FIG. 1. More complex write approaches may also use additional circuitry (not shown) creating the bias potential at terminals 616 and 618.

FIG. 6 also shows the configuration for performing a read operation. The bias condition may be similar to writing a "0" or a "1", but a different voltage is created over the MTJ 104. In addition, the bias voltages at terminals 618 and 616 are created by suitable sensing circuits (not shown) at terminals 616 or 618. Lifting the source line voltage 218 of the selected RD/WRT path will reduce the sub-threshold leakage currents of the deselected devices on that bit line 216 and source line 218.

FIG. 7 shows the configuration 700 for writing a "1" and creating the inverse current direction for 208 as shown in FIG. 2. The orientation of the bit line 216, MTJ 104, word line device 202, and source line 218 are reversed with respect to column selector switches 606, 608.

Referring to FIG. 8 and in accordance with an exemplary embodiment of the present inventions, a cell bias control circuit 802 as further described herein is coupled in accordance with the exemplary embodiments to memory cells 208 and RD/WRT circuits 804 and 806.

Read and write control of memory cells 208 within the ST-MRAM memory array 500 is provided by a complex control path comprising multiple serially connected devices. In such a serial voltage divider configuration, the resistance of the MTJ 104 compared to the total resistance of the path is a relatively small fraction. Therefore, precise simultaneous control of required voltage conditions at the MTJ 104 requires precise control of multiple analog control voltages at devices in the RD/WRT path of the memory cell 208. Some or all of these control voltages may be dependent on each other. In FIG. 8, three analog control voltages, N follower voltage $V_{NF}$ on output conductor 811, word line voltage $V_{WL}$ on output conductor 812, and P follower voltage $V_{PF}$ on output conductor 813 are provided by the cell bias control circuitry 802 in response to three reference voltages, reference MTJ voltage $V_{RMTJ}$ on input conductor 821, reference gate/source voltage $V_{RGS}$ on input conductor 822, and reference source line voltage $V_{RSL}$ on input conductor 823 ($V_{RBL}$ for the up current direction). Alternative embodiments may use a fixed lower read/write voltage $V_{RW2}$ (FIGS. 6 and 7), so that the P follower voltage $V_{PF}$ is not required. Certain RD/WRT circuits 804, 806 may require more than three control voltages. For enhanced or maximum memory chip efficiency and reliability, those control voltages may be automatically adjusted for all relevant supply voltage, temperature and/or process corner variations by a specific cell bias control unit.

Figure 9:
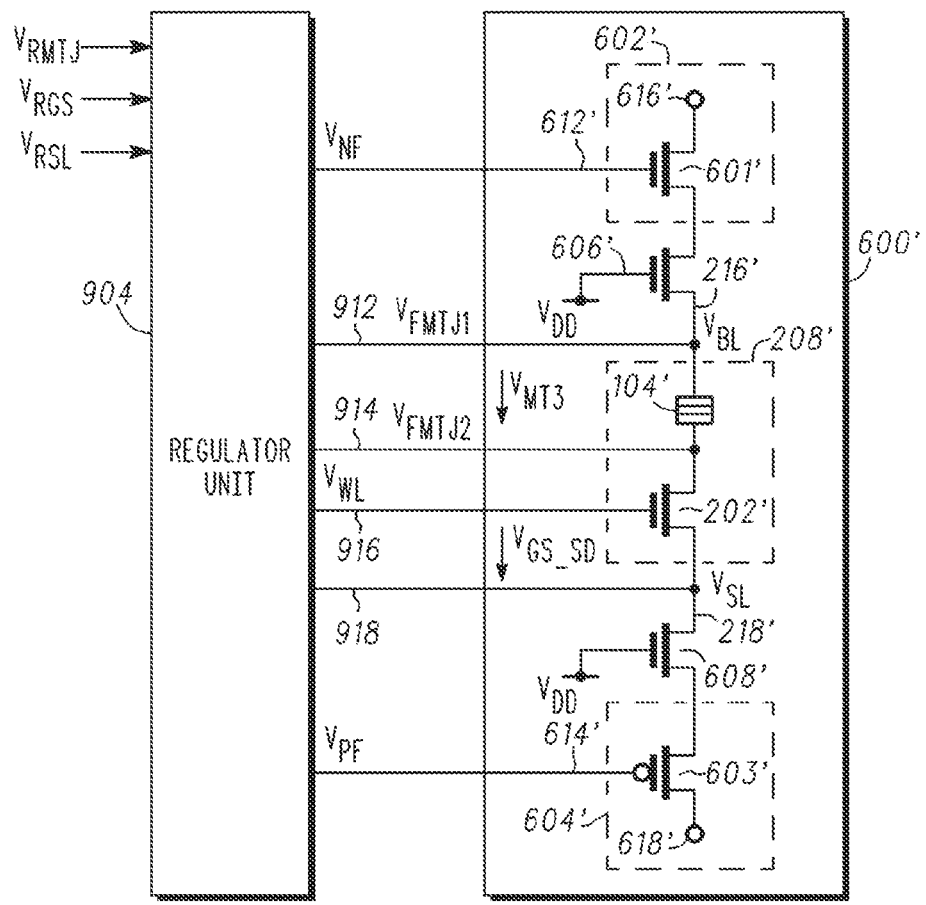
FIG. 9 is a block diagram illustrating the cell bias control circuit in accordance with a second exemplary embodiment wherein the MTJ is read or written with a current in a first direction from a bit line to a source line.

FIG. 9 illustrates a block diagram of one exemplary embodiment of a cell bias control circuitry 902 including a regulator unit 904 and a replica RD/WRT path 600'. The control voltages N follower voltage $V_{NF}$, word line voltage $V_{WL}$, and P follower voltage $V_{PF}$ shown in FIG. 8 are generated by the regulator unit 904 using the replica RD/WRT path 600' shown in FIG. 9 for writing a "0". Replica RD/WRT path 600' includes column select transistor 606' and column select transistor 608' and memory cell 208' similar to the RD/WRT path 600 of FIG. 6.

The replica RD/WRT path 600' provides feedback voltages $V_{FMTJ1}$ and $V_{FMTJ2}$ via conductors 912 and 914, respectively, and voltage $V_{SL}$ via conductor 918. The voltages $V_{SL}$ on source line 218, select device gate to source voltage $V_{GS\_SD}$, and $V_{MTJ}$ over the MTJ are regulated in response to the reference voltages $V_{RSL}$, $V_{RGS}$, and $V_{RMTJ}$ and feedback voltages $V_{FMTJ1}$ and $V_{FMTJ2}$ in a manner subsequently described in additional exemplary embodiments.

Figure 10:
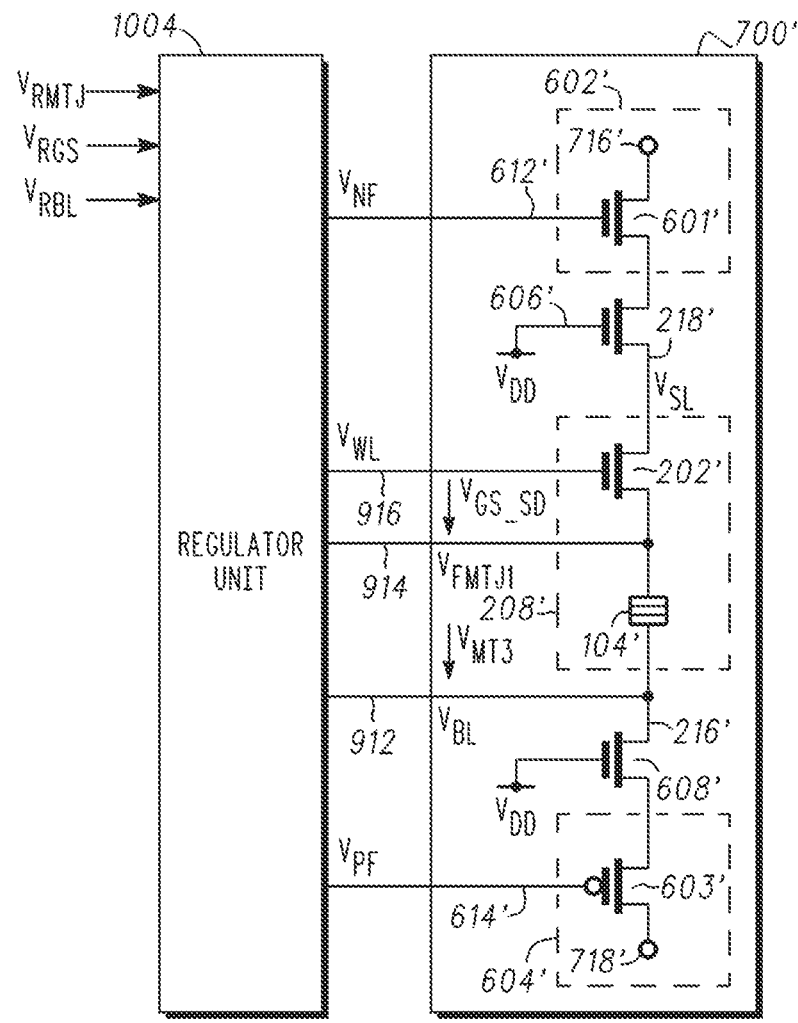
FIG. 10 is a block diagram illustrating the cell bias control circuit in accordance with a third exemplary embodiment wherein the MTJ is written with a current in a second direction from the source line to the bit line.

Likewise, FIG. 10 illustrates a block diagram of another exemplary embodiment of a cell bias control circuitry 1002 including a regulator unit 1004 and a replica RD/WRT path 700'. The control voltages N follower voltage $V_{NF}$, word line voltage $V_{WL}$, and P follower voltage $V_{PF}$ shown in FIG. 7 are generated by the regulator unit 1004 using the replica RD/WRT path 700' for writing a "1". Replica RD/WRT path 700' includes column select transistor 606' and column select transistor 608' and memory cell 208' similar to the RD/WRT path 700 of FIG. 7.

In a similar manner, the replica RD/WRT path 700' provides feedback voltages $V_{FMTJ1}$ and $V_{BL}$ via conductors 914 and 912, respectively. The voltages $V_{BL}$, $V_{MTJ}$, and $V_{GS\_SD}$ are regulated in response to the reference voltages $V_{RBL}$, $V_{RGS}$, and $V_{RMTJ}$ and feedback voltages $V_{FMTJ1}$ and $V_{BL}$ in a manner subsequently described in additional exemplary embodiments.

Figure 11:
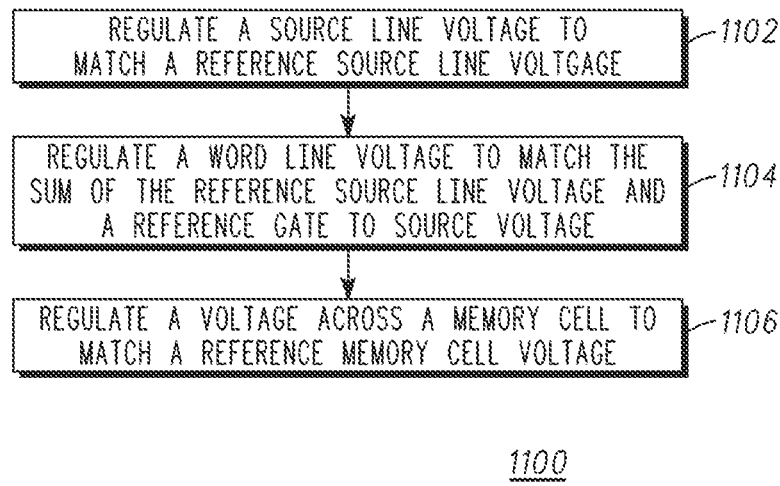
FIG. 11 is a flow chart of a method of reading and writing the STT-MRAM cell in accordance with the second exemplary embodiment.
Figure 12:
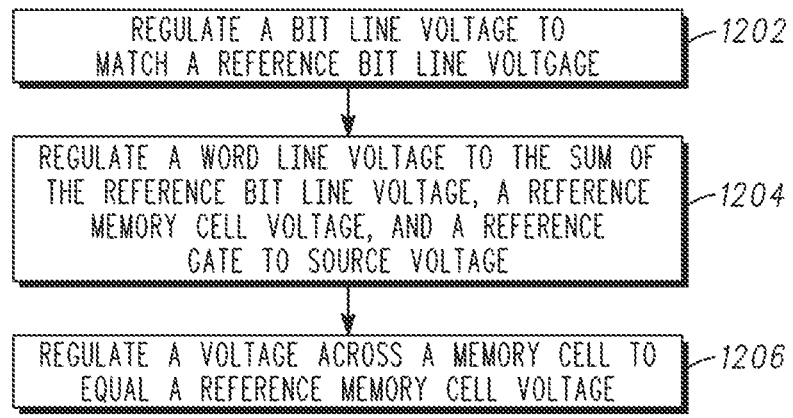
FIG. 12 is a flow chart of a method of writing the STT-MRAM cell in accordance with the third exemplary embodiment.

FIGS. 11 and 12 are flow charts describing how the voltages $V_{NF}$, $V_{WL}$, and $V_{PF}$ are regulated for reading and writing to a ST-MRAM. The various tasks performed in connection with methods 1100, 1200 may be performed by hardware, firmware, or any combination thereof. It should be appreciated that methods 1100, 1200 may include any number of additional or alternative tasks, the tasks shown in FIGS. 11 and 12 need not be performed in the illustrated order, and methods 1100, 1200 may be incorporated into a more comprehensive procedure or method having additional functionality not described in detail herein. Moreover, one or more of the tasks shown in FIGS. 11 and 12 could be omitted from an embodiment of the methods 1100, 1200 as long as the intended overall functionality remains intact.

Referring to FIG. 11, a method of an exemplary embodiment includes regulating 1102 a source line voltage to correlate to (for example, match or equal) a reference source line voltage, regulating 1104 a word line voltage to the sum of the reference source line voltage and a reference gate to source voltage, and regulating 1106 a voltage across a memory cell to equal a reference memory cell voltage.

Referring to FIG. 12, a method another exemplary embodiment includes 1202 regulating a bit line voltage to correlate to (for example, match or equal) a reference bit line voltage; regulating 1204 a word line voltage to the sum of the reference bit line voltage, a reference memory cell voltage, and a reference gate to source voltage; and regulating 1206 a voltage across a memory cell to equal a reference memory cell voltage.

Figure 13:
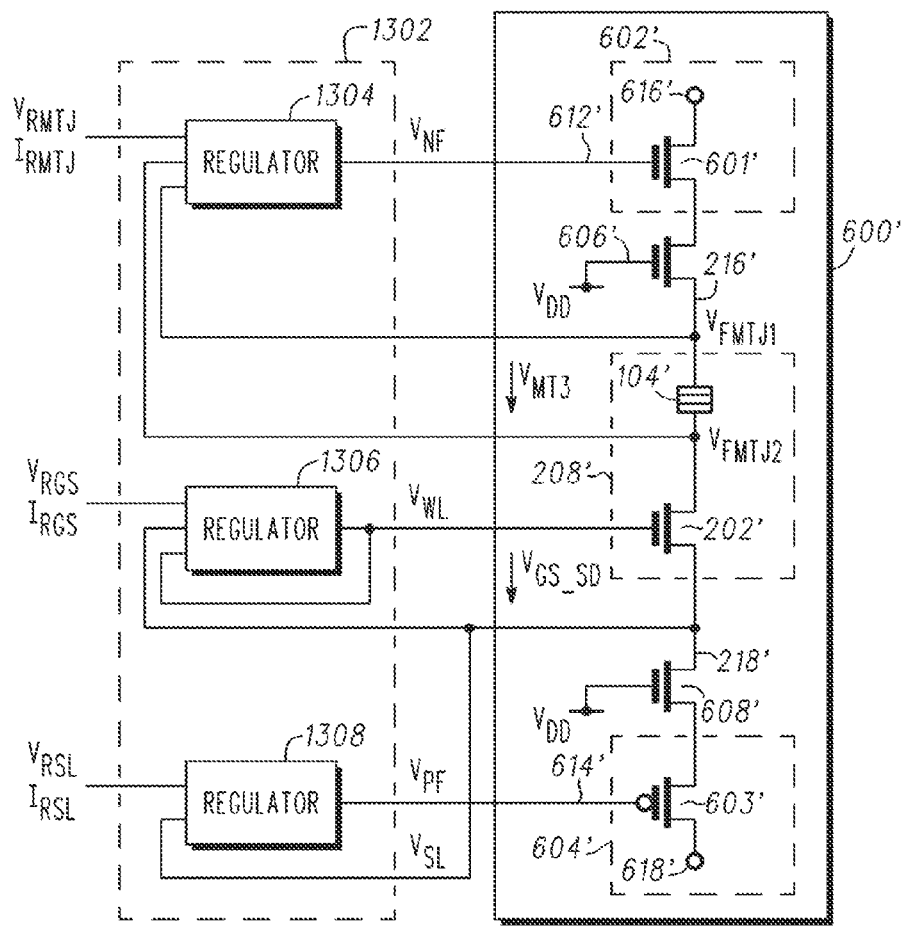
FIG. 13 is a block diagram and schematic of the cell bias control circuit in accordance with a fourth exemplary embodiment.

FIG. 13 shows one more detailed circuit implementation 1300 of the MTJ cell bias control circuit 802. The circuit 1300 allows for simultaneous control of the source line voltage $V_{SL}$, the gate-source voltage $V_{GS\_SD}$, and the voltage $V_{MTJ}$. These voltages are created by three regulators 1304, 1306, 1308 simultaneously controlling the reference voltages $V_{NF}$, $V_{WL}$, and $V_{PF}$ to a replica RD/WRT path 600' in response to the feedback voltages $V_{FMTJ1}$, $V_{FMTJ2}$, $V_{SL}$, and $V_{SL}$. FIG. 13 also illustrates the dependency of the regulated cell bias control voltages N follower voltage $V_{NF}$, word line voltage $V_{WL}$, and P follower voltage $V_{PF}$. Gate-source voltage $V_{GS\_SD}$ is regulated with reference to source line voltage $V_{SL}$. A defined value of MTJ voltage $V_{MTJ}$ is achieved by regulating N follower voltage $V_{NF}$ depending on the settings for select device gate to source voltage $V_{GS\_SD}$ and P follower voltage $V_{PF}$. The replica RD/WRT path 600' in FIG. 13 preferably correlates to (for example, matches or equals) the RD/WRT path in the memory arrays of the chip. This ensures that device, temperature, and supply voltage variations can be compensated. The input voltages to the three regulators $V_{RMTJ}$, $V_{RGS}$, $V_{RSL}$ are reference voltages of which any voltage level profile, e.g., for temperature dependence, can be defined. Alternatively, current references ($I_{RMTJ}$, $I_{RGS}$, and $I_{RSL}$) can be used as inputs.

Figure 14:
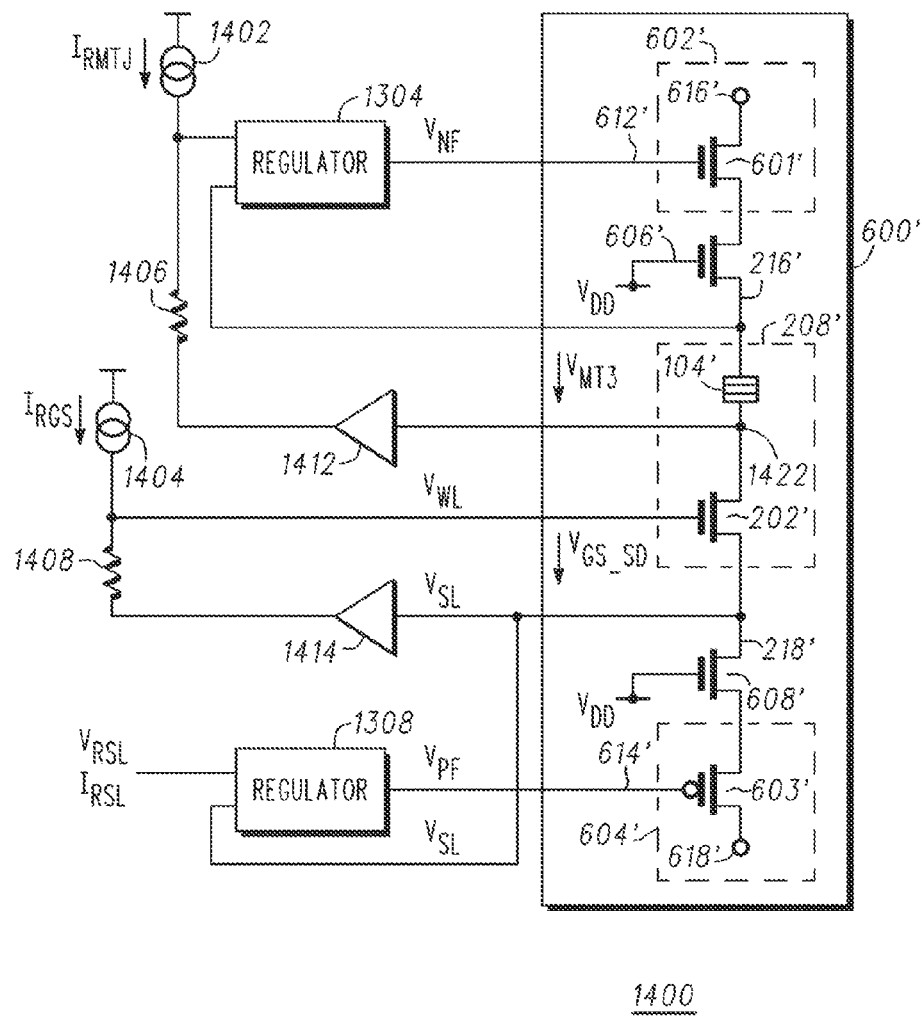
FIG. 14 is a block diagram and schematic of the cell bias control circuit in accordance with a fifth exemplary embodiment.

FIG. 14 shows another implementation 1400 for the MTJ cell bias control circuit 802. Current input controls 1402 and 1404 providing N follower current $I_{RMTJ}$ and $V_{GS}$ reference current IRGS (from FIG. 13), respectively In this exemplary embodiment, resistors 1406 and 1408 are used to set the reference voltage values for $V_{RMTJ}$ and $V_{RGS}$ by applying the reference currents $I_{RMTJ}$ and $I_{RGS}$ to these resistors 1406, 1408. In order not to affect the current in the reference path by the resistor currents, voltage buffer 1412, coupled between node 1422 and resistor 1406, and voltage buffer 1414, coupled between the source line 218 and resistor 1408, are used for isolation.

Figure 15:
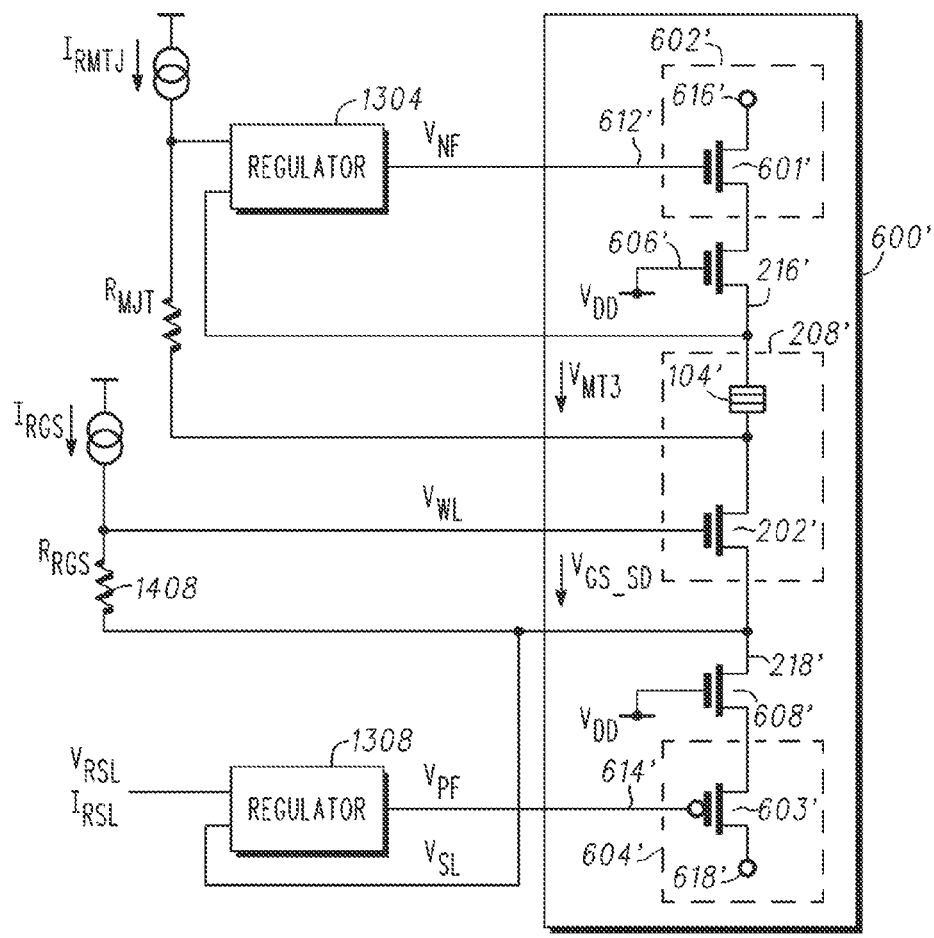
FIG. 15 is a block diagram and schematic of the cell bias control circuit in accordance with a sixth exemplary embodiment.

FIG. 15 shows yet another implementation of the invention. In order to adjust the voltage $V_{GS\_SD}$, the voltage across resistor 1408 is applied directly to the select device 202' of the replica path, thereby eliminating the need of a regulator. Also, the voltage buffer 1412, shown in FIG. 14, may also be omitted by connecting resistor 1406 directly to node 1422. This is possible since the error created in the reference path by the currents through the reference resistors is within the required precision ranges.

Figure 16:
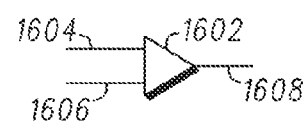
FIG. 16 is a schematic of a regulator unit of the exemplary embodiments of FIGS. 9, 10, and 13-15.

The regulator units 904, 1004, 1304, 1306, 1308 may be any circuitry that converts the reference voltages $V_{RSL}$, $V_{RGS}$, and $V_{RMTJ}$ to control voltages including P follower voltage $V_{PF}$, word line voltage $V_{WL}$, and N follower voltage $V_{NF}$, respectively. One exemplary embodiment of the regulator units 904, 1004, 1304, 1306, 1308 may be based on a differential (operational) amplifier 1600 (FIG. 16). A main input 1604 and feedback input 1606 result in an output 1608. For example, referring to regulator 1308 of FIG. 13, a main input receiving $V_{RSL}$ and feedback input $V_{SF}$ provide the output $V_{PF}$. Some regulators may comprise more than one feedback input. Implementation of regulators comprising more than one feedback input may be accomplished by combining multiple amplifiers 1602 and passive devices.

In summary, a cell bias control circuit maximizes the performance of devices in the RD/WRT path of memory cells (MTJ+transistor) without exceeding leakage current or reliability limits by automatically adjusting multiple control inputs of the RD/WRT path at the memory array according to predefined profiles over supply voltage, temperature, and process corner variations by applying any specific voltage profiles to the memory array.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A memory comprising:
   a memory array comprising:
      a plurality of bit lines;
      a plurality of source lines;
      a plurality of word lines; and
      a plurality memory cells, each of the memory cells comprising:
         a select device; and
         a memory device coupled in series with the select device, each memory cell configured to be coupled to one of the word lines, and selectively coupled between one of the bit lines and one of the source lines;

a replica circuit comprising:
  a replica bit line;
  a replica source line;
  a replica memory cell coupled between the replica bit line and the replica source line, the replica memory cell comprising:
    a replica memory device; and
    a replica select device coupled to the replica memory device and having a control electrode and at least one current carrying electrode; and
at least one regulator circuit coupled to the replica circuit and the memory array, the at least one regulator circuit configured to:
  receive a plurality of feedback voltages from the replica circuit, including:
    a first feedback voltage corresponding to a voltage between the replica select device and the replica memory device;
    a second feedback voltage corresponding to a voltage on the replica bit line;
    a third feedback voltage corresponding to a voltage on the replica source line; and
  regulate voltages of read/write circuitry corresponding to a selected memory cell of the plurality of memory cells, wherein the at least one regulator circuit regulates the voltages using the replica circuit including the plurality of feedback voltages received from the replica circuit, wherein the at least one regulator circuit is configured to:
    regulate a source line voltage on a selected source line or a bit line voltage on a selected bit line, wherein the selected memory cell is coupled between the selected source line and the selected bit line;
    regulate a word line voltage on a selected word line in response to a voltage across the control electrode of the replica select device and the at least one current carrying electrode of the replica select device; and
    regulate a memory device voltage across the memory device in response to a reference memory device voltage and a replica voltage across the replica memory device.

2. The memory of claim 1 wherein the at least one regulator circuit is further configured to:
  regulate the source line voltage on the selected source line in response to both a reference source line voltage and the voltage on the replica source line as indicated by the third feedback voltage.

3. The memory of claim 2 wherein the reference source line voltage is programmable.

4. The memory of claim 1 wherein the at least one regulator circuit is further configured to:
  regulate the bit line voltage on the selected bit line in response to both a reference bit line voltage and the voltage on the replica bit line as indicated by the second feedback voltage.

5. The memory of claim 4 wherein the reference bit line voltage is programmable.

6. The memory of claim 1 wherein the at least one regulator circuit is further configured to:
  regulate the word line voltage on the selected word line to maintain a reference control electrode to current carrying electrode voltage across a control electrode and a current carrying electrode of the select device of the selected memory cell.

7. The memory of claim 6 wherein the reference control electrode to current carrying electrode voltage is programmable.

8. The memory of claim 1 wherein each memory cell stores one of a first state having a first resistance range and a second state having a second resistance range, and the replica memory cell comprises at least one resistor having a resistance within the first resistance range or the second resistance range.

9. A method of providing bias voltages to a magnetic memory cell that includes a magnetic memory device coupled in series with a select device, the magnetic memory cell configured to be selectively coupled between a bit line and a source line, and the select device coupled to a word line, the method comprising:
  when writing a first state to the magnetic memory cell using current flowing through the magnetic memory cell in a first direction:
    applying a source line voltage on the source line;
    regulating a first word line voltage on the word line to a sum of the source line voltage and a first gate-to-source voltage of the select device, wherein the first word line voltage is regulated to correlate to a sum of the source line voltage and a first reference gate-to-source voltage; and
    regulating a first memory device voltage across the memory device to correlate to a first reference memory device voltage; and
  when writing a second state to the magnetic memory cell using current flowing through the magnetic memory cell in a second direction:
    applying a bit line voltage on the bit line;
    regulating a second word line voltage on the word line to a sum of the bit line voltage, a second memory device voltage, and a second gate-to-source voltage of the select device, wherein the second word line voltage is regulated to correlate to a sum of the bit line voltage, a second reference memory device voltage, and a second reference gate-to-source voltage; and
    regulating the second memory device voltage across the memory device to correlate to the second reference memory device voltage.

10. The method of claim 9 further comprising:
  when writing the first state to the magnetic memory cell, regulating the source line voltage applied on the source line to correlate to a reference source line voltage.

11. The method of claim 9 further comprising:
  when writing the second state to the magnetic memory cell, regulating the bit line voltage applied on the bit line to correlate to a reference bit line voltage.

12. The method of claim 9 further comprising:
  when writing the first state to the magnetic memory cell, maintaining the bit line at a fixed voltage level.

13. The method of claim 9 further comprising:
  when writing the second state to the magnetic memory cell, maintaining the source line at a fixed voltage level.

14. The method of claim 9, wherein regulating the first word line voltage further comprises:
  applying bias voltages to a replica circuit that includes a replica magnetic memory device, a replica select device, and replica circuitry corresponding to read/write circuitry for the magnetic memory cell;
  after applying the bias voltages, adjusting the bias voltages in response to a plurality of feedback voltages received from the replica circuit; and
  after adjusting the bias voltages, using a word line voltage applied to the replica select device in the replica circuit in regulating the first word line voltage.

15. The method of claim 14, wherein adjusting the bias voltages further comprises adjusting at least one of the bias voltages to correlate to at least one corresponding programmable voltage reference.

16. The method of claim 15, wherein adjusting at least one of the bias voltages further comprises regulating a voltage at a first terminal of the replica magnetic memory device.

17. The method of claim 15, wherein adjusting at least one of the bias voltages further comprises regulating a voltage at a terminal of the replica select device.

18. The method of claim 15, wherein adjusting at least one of the bias voltages further comprises regulating a voltage across the replica magnetic memory device.

19. The method of claim 15, wherein adjusting at least one of the bias voltages further comprises adjusting the word line voltage applied to the replica select device.

20. The method of claim 14, wherein the replica magnetic memory device includes a resistive element with a resistance proportional to a resistance of the magnetic memory device.

21. The method of claim 9, wherein regulating the first memory device voltage further comprises:
   applying bias voltages to a replica circuit that includes a replica magnetic memory device, a replica select device, and replica circuitry corresponding to read/write circuitry for the magnetic memory cell;
   after applying the bias voltages, adjusting the bias voltages in response to a plurality of feedback voltages received from the replica circuit; and
   after adjusting the bias voltages, using a voltage across the replica magnetic memory device in the replica circuit as the first reference memory device voltage.

22. The method of claim 9 further comprising:
when writing the first state to the magnetic memory cell:
   applying bias voltages to a replica circuit that includes a replica magnetic memory device, a replica select device, and replica circuitry corresponding to read/write circuitry for the magnetic memory cell;
   after applying the bias voltages, adjusting the bias voltages in response to a plurality of feedback voltages in received from the replica circuit; and
   after adjusting the bias voltages, regulating the source line voltage applied on the source line to correlate to a reference source line voltage, wherein the reference source line voltage corresponds to a voltage on a replica source line in the replica circuit.

23. The method of claim 9 further comprising:
when writing the second state to the magnetic memory cell:
   applying bias voltages to a replica circuit that includes a replica magnetic memory device, a replica select device, and replica circuitry corresponding to read/write circuitry for the magnetic memory cell;
   after applying the bias voltages, adjusting the bias voltages in response to a plurality of feedback voltages in received from the replica circuit; and
   after adjusting the bias voltages, regulating the bit line voltage applied on the bit line to correlate to a reference bit line voltage, wherein the reference bit line voltage corresponds to a voltage on a replica bit line in the replica circuit.

* * * * *